tion Data

United States Patent
Nakatsu et al.

(10) Patent No.: US 10,367,523 B2
(45) Date of Patent: Jul. 30, 2019

(54) DATA PROCESSING METHOD AND DATA PROCESSING APPARATUS

(71) Applicant: FUJITSU LIMITED, Kawasaki-shi, Kanagawa (JP)

(72) Inventors: Toshihide Nakatsu, Yokohama (JP); Masahiro Kataoka, Kamakura (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/938,672

(22) Filed: Mar. 28, 2018

(65) Prior Publication Data

US 2018/0287629 A1 Oct. 4, 2018

(30) Foreign Application Priority Data

Apr. 4, 2017 (JP) ................. 2017-074745

(51) Int. Cl.
*H03M 7/30* (2006.01)
*G06F 16/174* (2019.01)

(52) U.S. Cl.
CPC ...... *H03M 7/3088* (2013.01); *G06F 16/1744* (2019.01); *H03M 7/30* (2013.01)

(58) Field of Classification Search
CPC .... H03M 7/3088; H03M 7/30; H03M 7/4012; G06F 17/30153
USPC ............................. 341/51, 50, 106
See application file for complete search history.

(56) References Cited

U.S. PATENT DOCUMENTS

| | | | |
|---|---|---|---|
| 7,864,086 B2 * | 1/2011 | Monro | H03M 7/3082 341/107 |
| 2008/0074296 A1 * | 3/2008 | Kadono | G11B 20/1426 341/67 |
| 2012/0106620 A1 * | 5/2012 | Catania | H04Q 9/00 375/240 |
| 2012/0286031 A1 * | 11/2012 | Rothschild | G06K 19/06056 235/375 |

FOREIGN PATENT DOCUMENTS

| JP | 2011-090526 | 5/2011 |
|---|---|---|
| JP | 2011-145883 | 7/2011 |

* cited by examiner

*Primary Examiner* — Peguy Jean Pierre
(74) *Attorney, Agent, or Firm* — Fujitsu Patent Center

(57) ABSTRACT

A data processing method includes acquiring first encoded data and second encoded data when receiving a request for data processing, the first encoded data being encoded in accordance with a first encoding rule, the second encoded data being encoded in accordance with a second encoding rule, specifying a first code relating to a second code in accordance with the first encoding rule and the second encoding rule without decoding the first encoded data and the second coded data, the first code being included in the first encoded data, the second code being included in the second encoded data and generating third encoded data in which the first code and the second code are stored in association with each other.

17 Claims, 20 Drawing Sheets

FIG. 9

| | | | | /121 |
|---|---|---|---|---|
| PRODUCT CODE | PRODUCT NAME | UNIT PRICE | QUANTITY | ... |
| 1242 | CANDY | 50 | 20 | ... |
| 2342 | CHOCOLATE | 500 | 30 | ... |

FIG. 10

| RULE NUMBER | COLUMN TYPE |
|---|---|
| (1) | PRODUCT CODE |
| (2) | PRODUCT NAME |
| (3) | UNIT PRICE |
| (4) | QUANTITY |

FIG. 11

DYNAMIC DICTIONARY DATA /123

| DYNAMIC CODE | PRODUCT CODE |
|---|---|
| A000h | 1242 |
| A001h | 2342 |

⋮

| DYNAMIC CODE | PRODUCT CODE |
|---|---|
| A700h | CANDY |
| A701h | CHOCOLATE |

⋮

| DYNAMIC CODE | QUANTITY |
|---|---|
| AA00h | 20 |
| AA01h | 30 |

⋮

| DYNAMIC CODE | UNIT PRICE |
|---|---|
| A100h | 50 |
| A200h | 500 |

| IDENTIFICATION INFORMATION | ENCODING FILE |
|---|---|
| DATA SOURCE 100a | ENCODED FILE COLLECTED FROM DATA SOURCE 100a |
| DATA SOURCE 100b | ENCODED FILE COLLECTED FROM DATA SOURCE 100b |
| ... | ... |

221

DATA PROCESSING METHOD AND DATA PROCESSING APPARATUS

CROSS-REFERENCE TO RELATED APPLICATION

This application is based upon and claims the benefit of priority of the prior Japanese Patent Application No. 2017-74745, filed on Apr. 4, 2017, the entire contents of which are incorporated herein by reference.

FIELD

The embodiment discussed herein is related to data processing techniques.

BACKGROUND

There is an information system that acquires compressed files accumulated in plural data sources and executes data processing of combining, arithmetic operation, and so forth.

FIG. 20 is a diagram for explaining one example of an information system of a related art. The system illustrated in FIG. 20 includes data sources 10a and 10b and extraction, transmission, and loading (ETL) 20. The ETL 20 is coupled to the data sources 10a and 10b. The ETL 20 may be coupled to another data source that is not diagrammatically represented.

The data source 10a compresses a comma separated values (CSV) file F1 based on the ZIP and accumulates a compressed file F1' resulting from the compression in a storing unit. The data source 10b compresses a CSV file F2 based on the ZIP and accumulates a compressed file F2' resulting from the compression in the storing unit. The data source 10a transmits the compressed file F1' to the ETL 20 in response to an acquisition request from the ETL 20. The data source 10b transmits the compressed file F2' to the ETL 20 in response to an acquisition request from the ETL 20.

The ETL 20 acquires the compressed files F1' and F2' by transmitting the acquisition requests of the compressed files F1' and F2' to the data sources 10a and 10b. The ETL 20 executes data processing of combining, arithmetic operation, and so forth for the compressed files F1' and F2' and generates a CSV file F3 as the arithmetic operation result. One example of processing of the ETL 20 will be described below.

The compressed files F1' and F2' are not compressed in units of comma (or column). For this reason, after obtaining the CSV files F1 and F2 by decompressing the compressed files F1' and F2', the ETL 20 carries out lexical analysis and executes the data processing of combining, arithmetic operation, and so forth. In the example illustrated in FIG. 20, the ETL 20 executes arithmetic operation of the total amount of each product code based on master data M1.

For example, when the ETL 20 combines the CSV files F1 and F2, the quantity becomes "20" in total regarding a product code "1242" and a product name "Candy." Because the unit price is "50," the total amount becomes "1000 (20×50)." Similarly, regarding a product code "2342" and a product name "Chocolate," the quantity becomes "30" in total and the unit price is "500," and therefore the total amount becomes "15000 (30×500)."

As described above, the ETL 20 generates the CSV file F3 by executing the processing of combining, arithmetic operation, and so forth after decompressing the compressed files F1' and F2' and carrying out the lexical analysis. Then, the ETL 20 obtains a compressed file F3' by compressing the CSV file F3 based on the ZIP. The ETL 20 transmits the compressed file F3' to an external apparatus that is not diagrammatically represented and is the request source of the data processing.

For example, related arts are disclosed in Japanese Laid-open Patent Publication No. 2011-145883 and Japanese Laid-open Patent Publication No. 2011-090526.

SUMMARY

According to an aspect of the embodiment, a data processing method includes acquiring first encoded data and second encoded data when receiving a request for data processing, the first encoded data being encoded in accordance with a first encoding rule, the second encoded data being encoded in accordance with a second encoding rule, specifying a first code relating to a second code in accordance with the first encoding rule and the second encoding rule without decoding the first encoded data and the second coded data, the first code being included in the first encoded data, the second code being included in the second encoded data and generating third encoded data in which the first code and the second code are stored in association with each other.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 9 is a diagram illustrating one example of a data structure of a target file;

FIG. 10 is a diagram illustrating one example of a data structure of encoding rule data;

FIG. 11 is a diagram illustrating one example of a data structure of dynamic dictionary data;

FIG. 14 is a diagram illustrating one example of a data structure of an encoded file table;

DESCRIPTION OF EMBODIMENT

The above-described related art involves a problem that analysis processing about each of pieces of data from plural data sources is executed and thus it is difficult to execute the data processing between pieces of target data at high speed. For example, in the information system according to the related art, when the respective compressed files are received, it is not until the compressed files have been decompressed and lexical analysis has been carried out that the data processing of combining, arithmetic operation, and so forth may be executed. Such a problem similarly occurs even when only data used for arithmetic operation is received as the compressed files.

An embodiment of a data processing program, a data processing method, and a data processing apparatus disclosed by the present application will be described in detail below based on the drawings. It is to be noted that techniques of the present application are not limited by the embodiment.

Figure 1:
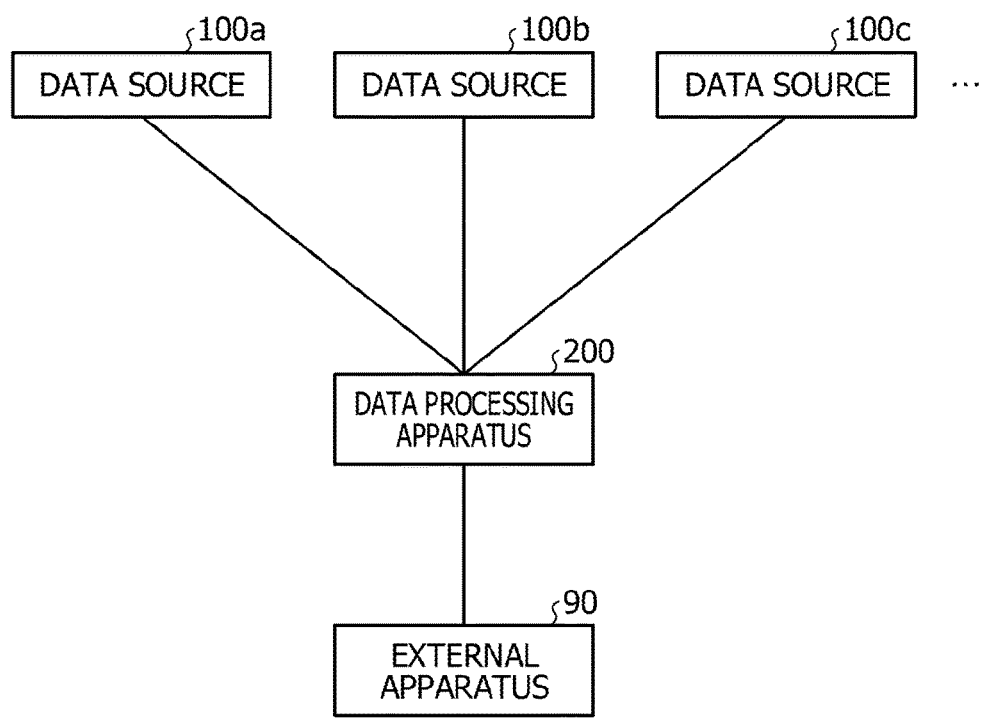
FIG. 1 is a diagram illustrating one example of a system according to an embodiment.

FIG. 1 is a diagram illustrating one example of a system according to the present embodiment. As illustrated in FIG. 1, this system includes an external apparatus 90, data sources 100a, 100b, and 100c, and a data processing apparatus 200. The data processing apparatus 200 is coupled to the external apparatus 90. Furthermore, the data processing apparatus 200 is coupled to the data sources 100a to 100c. Although the data sources 100a to 100c are illustrated here, this system may include another data source. Moreover, in the following description, the data sources 100a to 100c will be collectively represented as the data sources 100 as appropriate.

The external apparatus 90 is an apparatus that issues, to the data processing apparatus 200, a request for data processing with use of CSV files accumulated in the data sources 100. For example, combining of CSV files, arithmetic operation of numerical values, and so forth are included in the contents of the data processing.

When receiving the request for data processing from the external apparatus 90, the data processing apparatus 200 transmits a data acquisition instruction corresponding to the request for data processing to the data source 100. For example, the data acquisition instruction includes information with which the column of the CSV file as the acquisition target is uniquely identified.

The data processing apparatus 200 receives, from the data source 100, an encoded file that corresponds to the data acquisition instruction and is encoded based on a given encoding rule. The data processing apparatus 200 uses the given encoding rule and the encoded file to execute the data processing requested by the external apparatus 90 in the state in which the target data remains encoded. The data processing apparatus 200 distributes the processing result of the data to the external apparatus 90.

The data source 100 accumulates CSV files. When receiving a data acquisition instruction from the data processing apparatus 200, the data source 100 extracts a column part corresponding to the data acquisition instruction in the CSV files and executes encoding in accordance with a given encoding rule. The data source 100 transmits an encoded file resulting from the encoding to the data processing apparatus 200.

Figure 2:
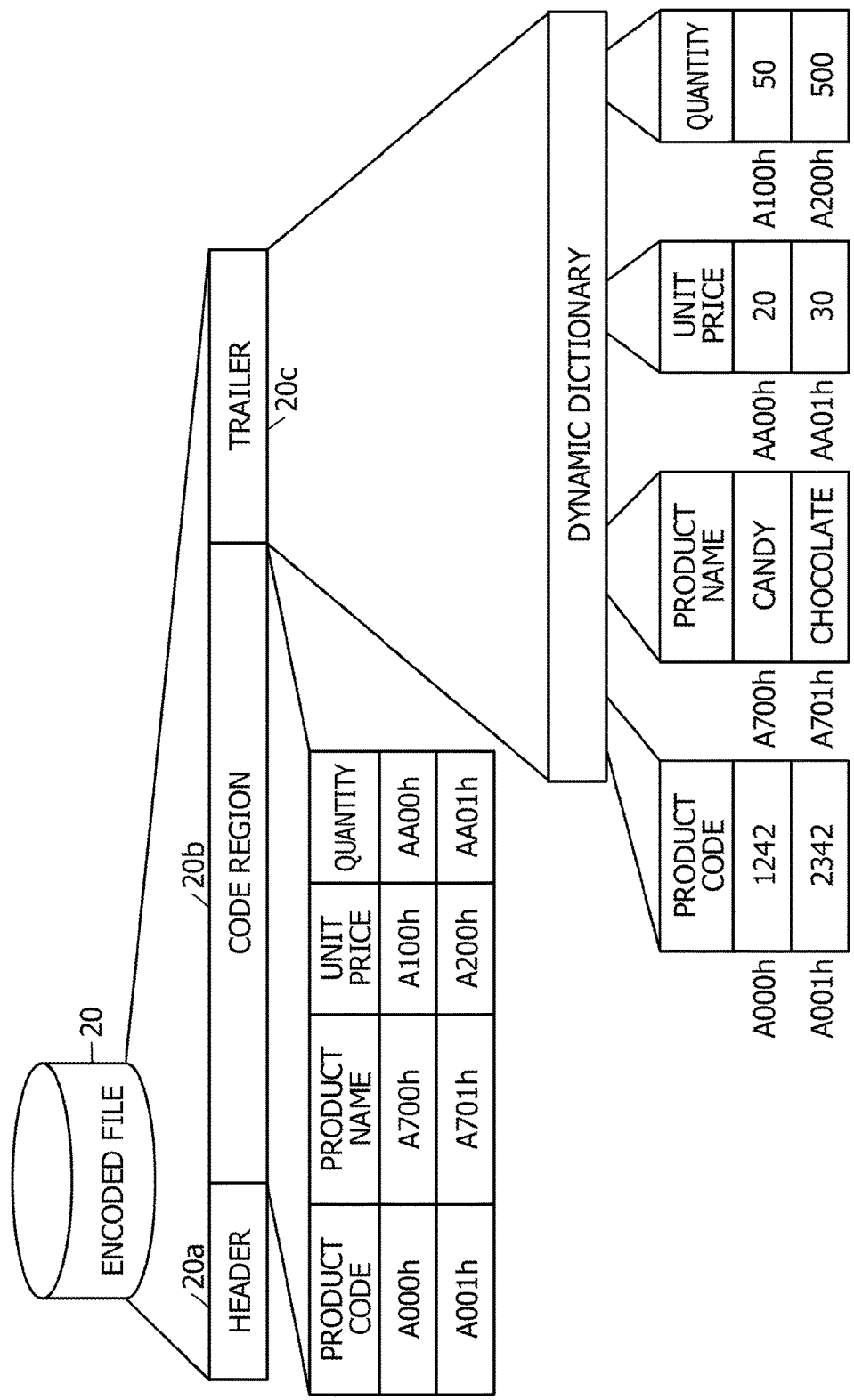
FIG. 2 is a diagram for explaining one example of an encoded file.

FIG. 2 is a diagram for explaining one example of an encoded file. As illustrated in FIG. 2, an encoded file 20 includes a header 20a, a code region 20b, and a trailer 20c. In the header 20a, various kinds of control information are included.

In the code region 20b, a CSV file that corresponds to a data acquisition instruction and is encoded based on a given encoding rule is included. Suppose that the encoded CSV file is encoded in units of column.

The trailer 20c includes information on a dynamic dictionary. The dynamic dictionary is information in which words or numerical values included in columns are associated with dynamic codes. Encoding of the encoded CSV file stored in the code region 20b is carried out based on the dynamic dictionary stored in the trailer 20c.

In an example represented in a dynamic dictionary in FIG. 2, the dynamic codes of product codes "1242" and "2342" are "A000h" and "A001h," respectively. The dynamic codes of product names "Candy" and "Chocolate" are "A700h" and "A701h," respectively. The dynamic codes of quantities "20" and "30" are "AA00h" and "AA01h," respectively. The dynamic codes of unit prices "50" and "500" are "A100h" and "A200h," respectively.

Subsequently, one example of data processing executed by the data processing apparatus 200 will be described. FIG. 3 to FIG. 6 are diagrams illustrating one example of data processing executed by a data processing apparatus. Description will be made about FIG. 3. In an example illustrated in FIG. 3, the case in which the data processing apparatus 200 acquires encoded files from the data sources 100a and 100b and combines the respective encoded files will be described.

Suppose that encoded data 21a is stored in the code region of the encoded file acquired from the data source 100a and a dynamic dictionary 21b is stored in the trailer. Suppose that encoded data 22a is stored in the code region of the encoded file acquired from the data source 100b and a dynamic dictionary 22b is stored in the trailer.

Suppose that, as a premise, the data sources 100a and 100b encode data based on an encoding rule 50a. The encoding rule 50a is a rule that defines columns having data of product code, product name, and quantity as the columns of the encoding target among the respective columns included in a CSV file and defines the order of arrangement of the columns as order of the column of the product code, the column of the product name, and the column of the quantity.

For example, the data included in the column of rule number (1) of the pieces of data 21a and 22a is dynamic codes of the product code. The data included in the column of rule number (2) of the pieces of data 21a and 22a is dynamic codes of the product name. The data included in the column of rule number (3) of the pieces of data 21a and 22a is dynamic codes of the quantity.

The data processing apparatus 200 generates data 60a by combining the pieces of data of the columns corresponding to the same rule number based on the encoding rule 50a.

Furthermore, the data processing apparatus 200 generates a dynamic dictionary 60b by combining the dynamic dictionary 21b and the dynamic dictionary 22b.

The data processing apparatus 200 generates an encoded file by storing the data 60a in the code region of the encoded file and storing the dynamic dictionary 60b in the trailer of the encoded file. The data processing apparatus 200 distributes the generated encoded file to the external apparatus 90.

Figure 3:
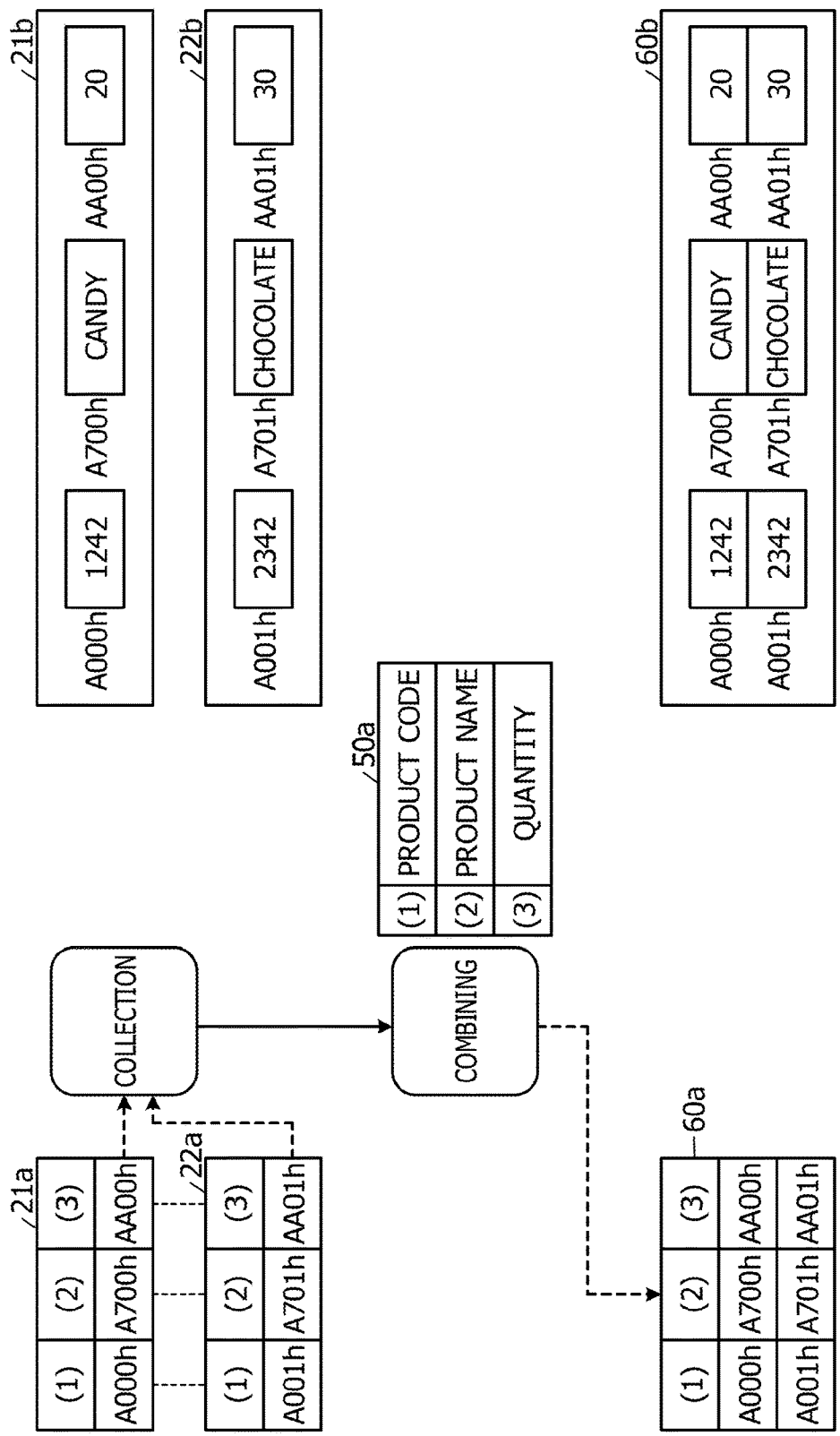
FIG. 3 is a diagram (first diagram) illustrating one example of data processing executed by a data processing apparatus.

As described with FIG. 3, the data processing apparatus 200 combines the encoded files acquired from the data sources 100a and 100b based on the encoding rule 50a, with the encoded state of the encoded files kept (without decoding the encoded files). Thus, the combining of the target encoded files may be carried out at high speed.

Next, description will be made about FIG. 4. In an example illustrated in FIG. 4, the case in which the data processing apparatus 200 acquires encoded files from the data sources 100a and 100b and combines the respective encoded files will be described.

Suppose that encoded data 23a is stored in the code region of the encoded file acquired from the data source 100a and a dynamic dictionary 23b is stored in the trailer. Suppose that encoded data 24a is stored in the code region of the encoded file acquired from the data source 100b and a dynamic dictionary 24b is stored in the trailer.

Suppose that, as a premise, the data sources 100a and 100b encode data based on the encoding rule 50a described with FIG. 3. The encoding rule 50a is a rule that defines columns having data of product code, product name, and quantity as the columns of the encoding target among the respective columns included in a CSV file and defines the order of arrangement of the columns as order of the column of the product code, the column of the product name, and the column of the quantity.

For example, the data included in the column of rule number (1) of the pieces of data 23a and 24a is dynamic codes of the product code. The data included in the column of rule number (2) of the pieces of data 23a and 24a is dynamic codes of the product name. The data included in the column of rule number (3) of the pieces of data 23a and 24a is dynamic codes of the quantity.

The data processing apparatus 200 generates data 61a by combining the pieces of data 23a and 24a of the columns corresponding to the same rule number based on the encoding rule 50a. Furthermore, the data processing apparatus 200 generates a dynamic dictionary 61b by combining the dynamic dictionary 23b and the dynamic dictionary 24b.

The data processing apparatus 200 refers to the dynamic dictionary 61b and determines whether or not overlapping of dynamic codes exists. In the case of this example, a dynamic code "AA00h" allocated to quantity "20" and a dynamic code "AA00h" allocated to quantity "10" overlap. If dynamic codes overlap as above, the data processing apparatus 200 carries out adjustment of the dynamic code. For example, the data processing apparatus 200 changes the dynamic code allocated to the quantity "10" from "AA00h" to "AA02h."

The data processing apparatus 200 adjusts the dynamic code of the data 61a in association with the adjustment of the dynamic code. For example, the dynamic code corresponding to the quantity "10" is a dynamic code "AA00h" located on the third row and third column of the data 61a. The data processing apparatus 200 changes the dynamic code "AA00h" on the third row and third column to a dynamic code "AA02h" to generate data 62a.

The data processing apparatus 200 generates an encoded file by storing the data 62a in the code region of the encoded file and storing a dynamic dictionary 62b in the trailer of the encoded file. The data processing apparatus 200 distributes the generated encoded file to the external apparatus 90.

Figure 4:
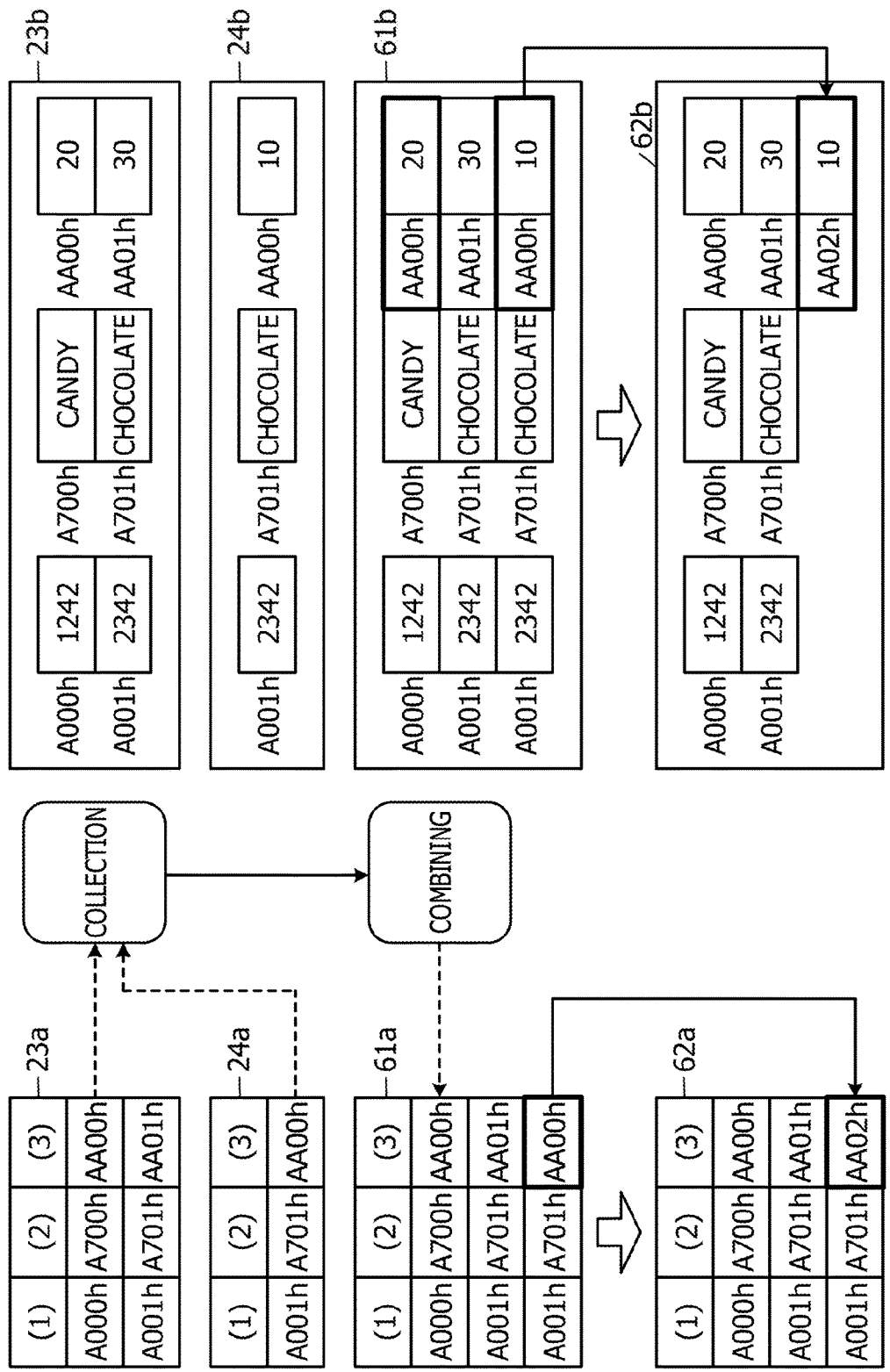
FIG. 4 is a diagram (second diagram) illustrating one example of data processing executed by a data processing apparatus.

Furthermore, as described with FIG. 4, if overlapping of dynamic codes exists in the dynamic dictionary 61b resulting from combining, the data processing apparatus 200 resolves the overlapping of dynamic codes by carrying out adjustment of the dynamic code. Furthermore, the data processing apparatus 200 changes the corresponding dynamic code of the data 61a according to the adjustment of the dynamic code to obtain the data 62a. Thus, it is possible to combine the encoded files, with the encoded state of the encoded files kept (without decoding the encoded files), while resolving the overlapping of dynamic codes.

Description will be made about FIG. 5. In an example illustrated in FIG. 5, the case in which the data processing apparatus 200 acquires an encoded file from the data source 100a and combines the encoded file and master data of the data processing apparatus 200 will be described.

Suppose that encoded data 25a is stored in the code region of the encoded file acquired from the data source 100a and a dynamic dictionary 25b is stored in the trailer. Suppose that, as a premise, the data source 100a encodes data based on the encoding rule 50a. The encoding rule 50a is what defines columns having data of product code, product name, and quantity as the columns of the encoding target among the respective columns included in a CSV file. Furthermore, the encoding rule 50a defines the order of arrangement of the columns as order of the column of the product code, the column of the product name, and the column of the quantity.

For example, the data included in the column of rule number (1) of the data 25a is dynamic codes of the product code. The data included in the column of rule number (2) of the data 25a is dynamic codes of the product name. The data included in the column of rule number (3) of the data 25a is dynamic codes of the quantity.

Furthermore, suppose that the data processing apparatus 200 generates data 26a by encoding the master data based on an encoding rule 50b. The encoding rule 50b is a rule that defines columns having data of product code and unit price as the columns of the encoding target among the respective columns included in a CSV file and defines the order of arrangement of the columns as order of the column of the product code and the column of the unit price.

For example, the data included in the column of rule number (1) of the data 26a is dynamic codes of the product code. The data included in the column of rule number (4) of the data 26a is dynamic codes of the unit price.

The data processing apparatus 200 generates data 63a by comparing the pieces of data of the same column (product code) based on the encoding rules 50a and 50b and adding the column corresponding to the data 26a that matches the data 25a (unit price) to the data 25a. For example, a dynamic code "A000h" of the product code on the first row and first column of the data 25a matches a dynamic code "A000h" on the first row and first column of the data 26a. Thus, the data processing apparatus 200 registers a dynamic code "A100h" on the first row and second column of the data 26a onto the first row and fourth column of the data 63a.

For example, a dynamic code "A001h" of the product code on the second row and first column of the data 25a matches a dynamic code "A001h" on the second row and first column of the data 26a. Thus, the data processing apparatus 200 registers a dynamic code "A200h" on the second row and second column of the data 26a onto the second row and fourth column of the data 63a.

The data processing apparatus 200 generates an encoding rule 50c by combining the encoding rule 50a and the encoding rule 50b. The encoding rule 50c is an encoding rule corresponding to the data 63a after the combining.

The data processing apparatus 200 generates a dynamic dictionary 63b by combining the dynamic dictionary 25b and a dynamic dictionary 26b. It is to be noted that if plural pairs exist as pairs of the same dynamic code and word, the data processing apparatus 200 unifies these pairs into one pair.

The data processing apparatus 200 generates an encoded file by storing the data 63a in the code region of the encoded file and storing the dynamic dictionary 63b and the encoding rule 50c in the trailer. The data processing apparatus 200 distributes the generated encoded file to the external apparatus 90.

Figure 5:
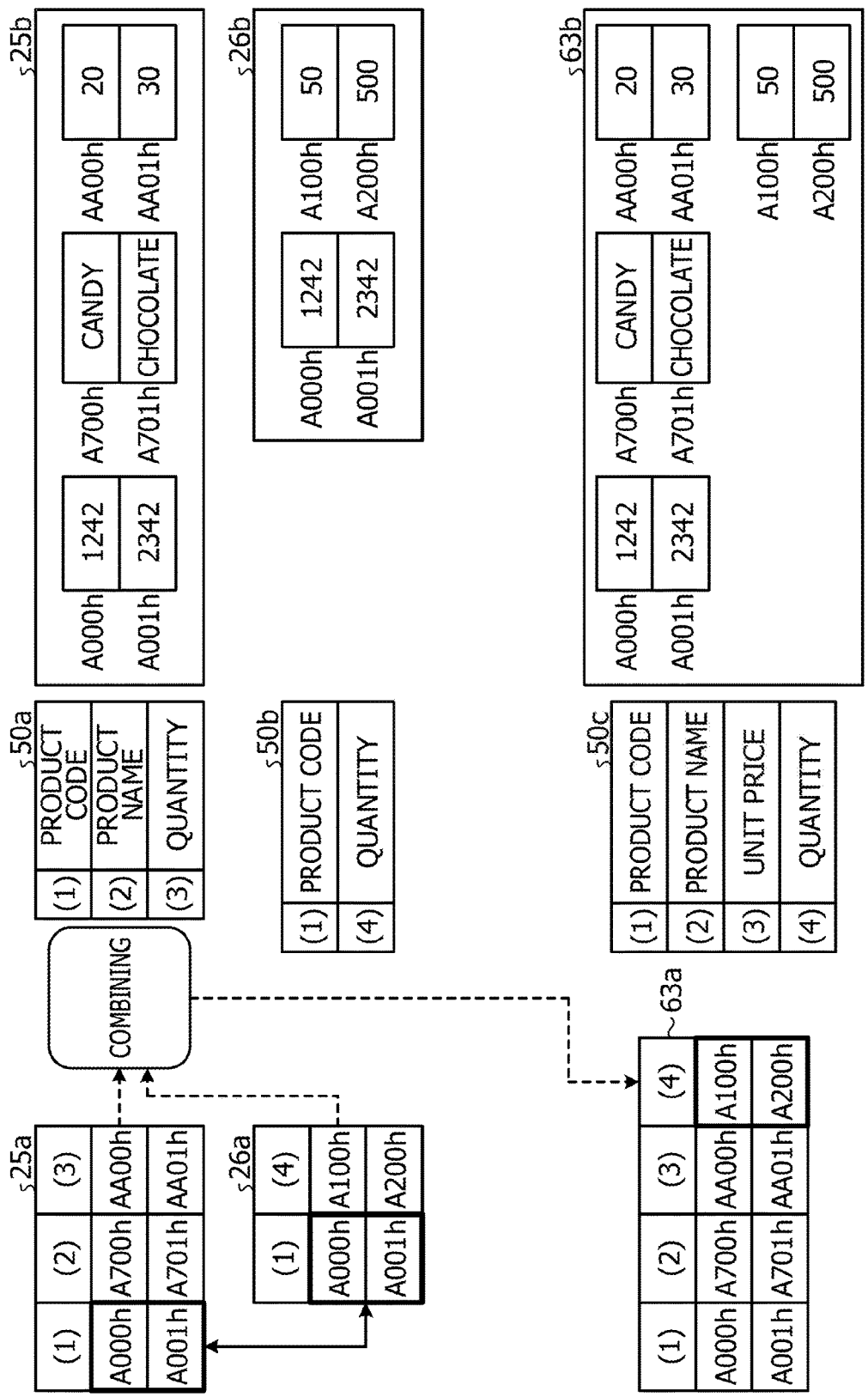
FIG. 5 is a diagram (third diagram) illustrating one example of data processing executed by a data processing apparatus.

As described with FIG. 5, the data processing apparatus 200 acquires an encoded file from the data source 100a and combines the encoded file and encoded master data based on the encoding rules 50a and 50b, with the encoded state of the encoded file and encoded master data kept (without decoding the encoded file and encoded master data). Thus, the combining of the target encoded files may be carried out at high speed.

Next, description will be made about FIG. 6. In an example illustrated in FIG. 6, the case in which the data processing apparatus 200 acquires an encoded file from the data source 100a and carries out given arithmetic operation, with the encoded state of the encoded file kept, will be described. Here, as one example, the case in which the data processing apparatus 200 carries out arithmetic operation of the total amount of each product based on the quantity and unit price of the product will be described.

Suppose that encoded data 27a is stored in the code region of the encoded file acquired from the data source 100a and a dynamic dictionary 27b is stored in the trailer. Suppose that, as a premise, the data source 100a encodes data based on an encoding rule 50d. The encoding rule 50d is what defines columns having data of product code, product name, unit price, and quantity as the columns of the encoding target among the respective columns included in a CSV file. Furthermore, the encoding rule 50d defines the order of arrangement of the columns as order of the column of the product code, the column of the product name, the column of the unit price, and the column of the quantity.

For example, the data included in the column of rule number (1) of the data 27a is dynamic codes of the product code. The data included in the column of rule number (2) of the data 27a is dynamic codes of the product name. The data included in the column of rule number (3) of the data 27a is dynamic codes of the unit price. The data included in the column of rule number (4) of the data 27a is dynamic codes of the quantity.

Furthermore, the data processing apparatus 200 prepares a dynamic dictionary 28b for storing the column of the total amount before carrying out the arithmetic operation of the total amount. In the dynamic dictionary 28b in FIG. 6, a dynamic code "D000h" allocated to the total amount corresponding to a product code "1242 (A000h)" is set. A dynamic code "D001h" allocated to the total amount corresponding to a product code "2342 (A001h)" is set.

Moreover, the data processing apparatus 200 generates data 64a by combining data 28a including the dynamic codes allocated in the dynamic dictionary 28b and the data 27a. The data processing apparatus 200 generates a dynamic dictionary 64b by combining the dynamic dictionary 27b and the dynamic dictionary 28b.

After executing the above-described processing, the data processing apparatus 200 carries out arithmetic operation of the total amount corresponding to the product code "1242 (A000h)" and the total amount corresponding to the product code "2342 (A001h)," and sets the calculation result in the dynamic dictionary 28b.

One example of processing of the arithmetic operation of the total amount corresponding to the product code "1242 (A000h)" will be explained. Regarding the data 27a, the dynamic code of the unit price corresponding to the product code "1242" is "A100h" and the dynamic code of the quantity is "AA00h." Therefore, the data processing apparatus 200 obtains unit price "50" and quantity "20" through comparison with the dynamic dictionary 27b. The data processing apparatus 200 calculates a total amount "1000" by multiplying the unit price "50" and the quantity "20." The data processing apparatus 200 stores the total amount "1000" as the arithmetic operation result in the column corresponding to the dynamic code "D000h" of the dynamic dictionary 64b.

One example of processing of the arithmetic operation of the total amount corresponding to the product code "2342 (A001h)" will be explained. Regarding the data 27a, the dynamic code of the unit price corresponding to the product code "2342" is "A200h" and the dynamic code of the quantity is "AA01h." Therefore, the data processing apparatus 200 obtains unit price "500" and quantity "30" through comparison with the dynamic dictionary 27b. The data processing apparatus 200 calculates a total amount "15000" by multiplying the unit price "500" and the quantity "30." The data processing apparatus 200 stores the total amount "15000" as the arithmetic operation result in the column corresponding to the dynamic code "D001h" of the dynamic dictionary 64b.

The data processing apparatus 200 generates an encoded file by storing the data 64a in the code region of the encoded file and storing the dynamic dictionary 64b in the trailer. The data processing apparatus 200 distributes the generated encoded file to the external apparatus 90.

Figure 6:
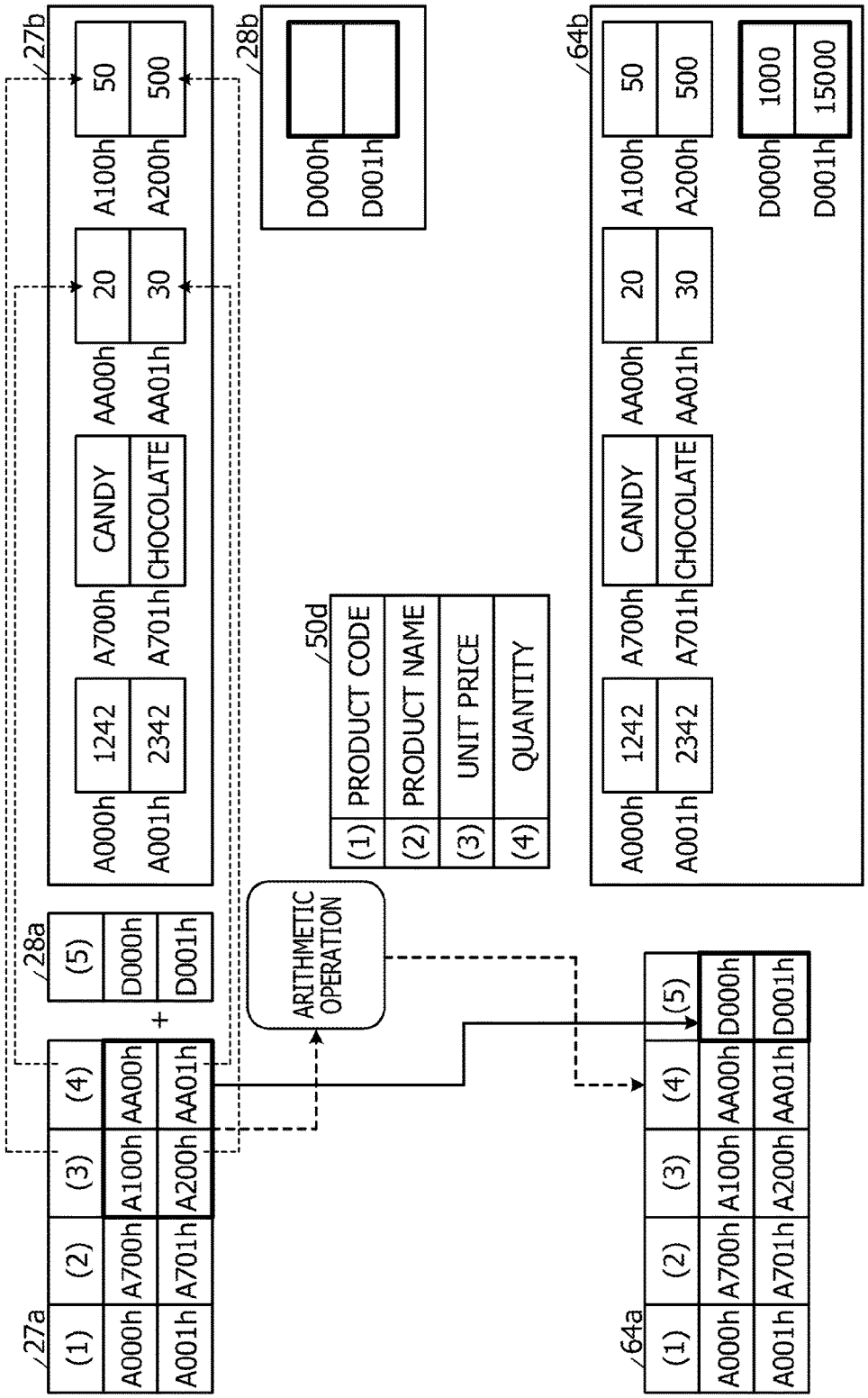
FIG. 6 is a diagram (fourth diagram) illustrating one example of data processing executed by a data processing apparatus.

As described with FIG. 6, the data processing apparatus 200 acquires an encoded file from the data source 100a and carries out arithmetic operation, with the encoded state of the encoded file kept (without decoding the encoded file), and generates an encoded file including the arithmetic operation result. Thus, the arithmetic operation on the encoded file may be carried out at high speed compared with the related art.

Figure 7:
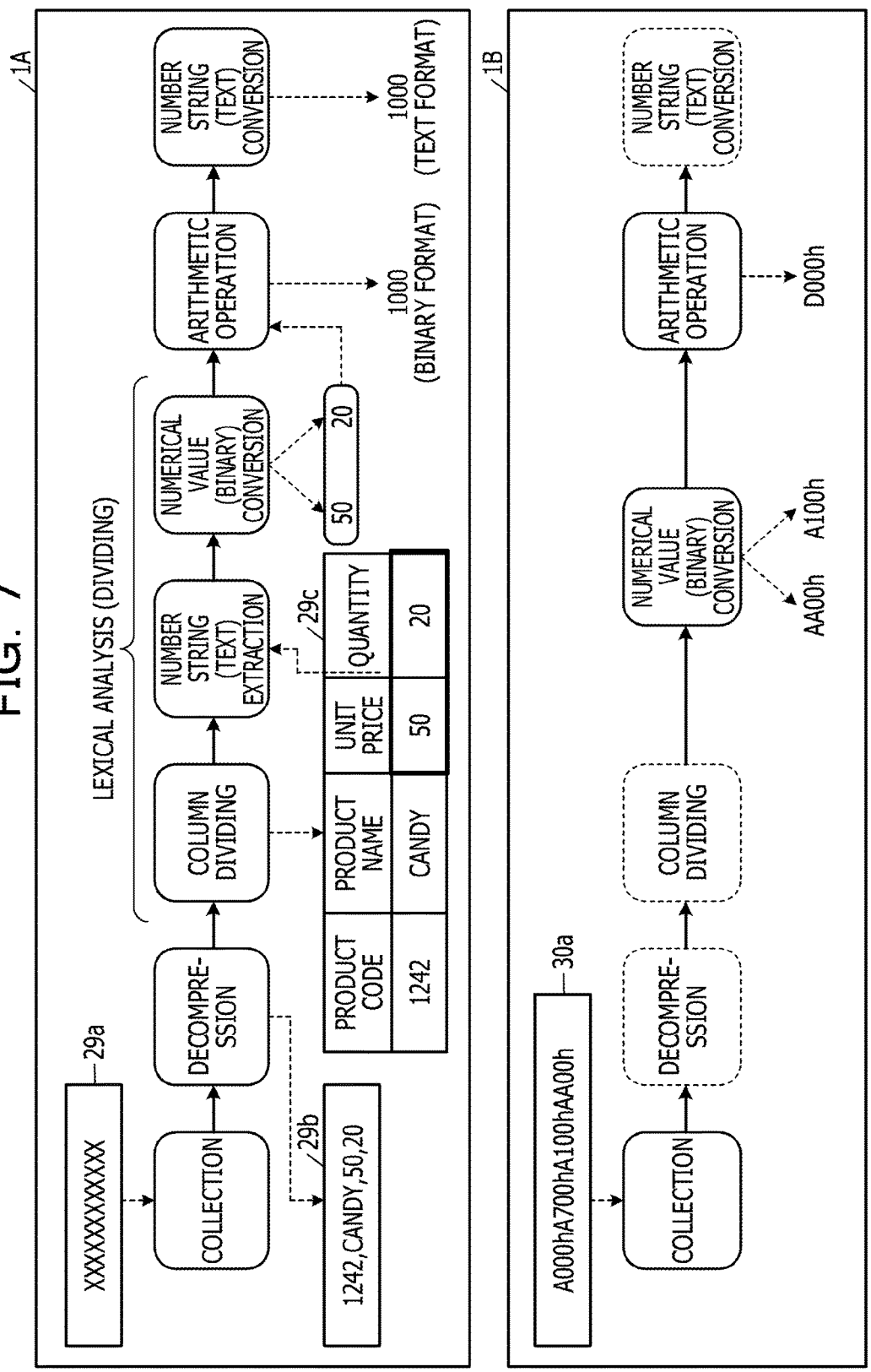
FIG. 7 is a diagram for explaining an effect of a data processing apparatus according to an embodiment.

FIG. 7 is a diagram for explaining an effect of a data processing apparatus according to the present embodiment. Processing 1A illustrated in FIG. 7 represents processing of the related art and processing 1B represents processing of the data processing apparatus 200 explained with FIG. 6.

The processing 1A in FIG. 7 will be described. The related art collects data 29a encoded based on the ZIP or the like. Because the data 29a is not encoded in units of column, the related art decompresses the data 29a to generate data 29b. The related art carries out lexical analysis of the data 29b to divide the data 29b in units of column and generate data 29c. The related art extracts number strings (text) of the unit price and quantity of the data 29c and converts the number strings to numerical values (binary). The related art carries out arithmetic operation of the numerical values to obtain the arithmetic operation result (binary). The related art converts the arithmetic operation result (binary) to a number string (text). In the related art, the arithmetic operation result for being distributed to the distribution destination may be obtained by going through the process of collection, decompression, column dividing, number string extraction, numerical value conversion, arithmetic operation, and number string conversion as described above.

The processing 1B in FIG. 7 will be described. The data processing apparatus 200 collects data 30a encoded in units of column. The data 30a corresponds to the record on the first row of the data 27a described with FIG. 6. The data processing apparatus 200 skips processing of decompression and column dividing and extracts numerical values (binary) from the data 30a. The information corresponding to the extracted numerical values is stored in a dynamic dictionary. Thus, arithmetic operation is carried out by using numerical values in the dynamic dictionary and the arithmetic operation result is stored in the dynamic dictionary. Compared with the related art, the data processing apparatus 200 according to the present embodiment may obtain the arithmetic operation result for being distributed to the distribution destination without executing processing of decompression, column dividing, and conversion from text to binary.

Figure 8:
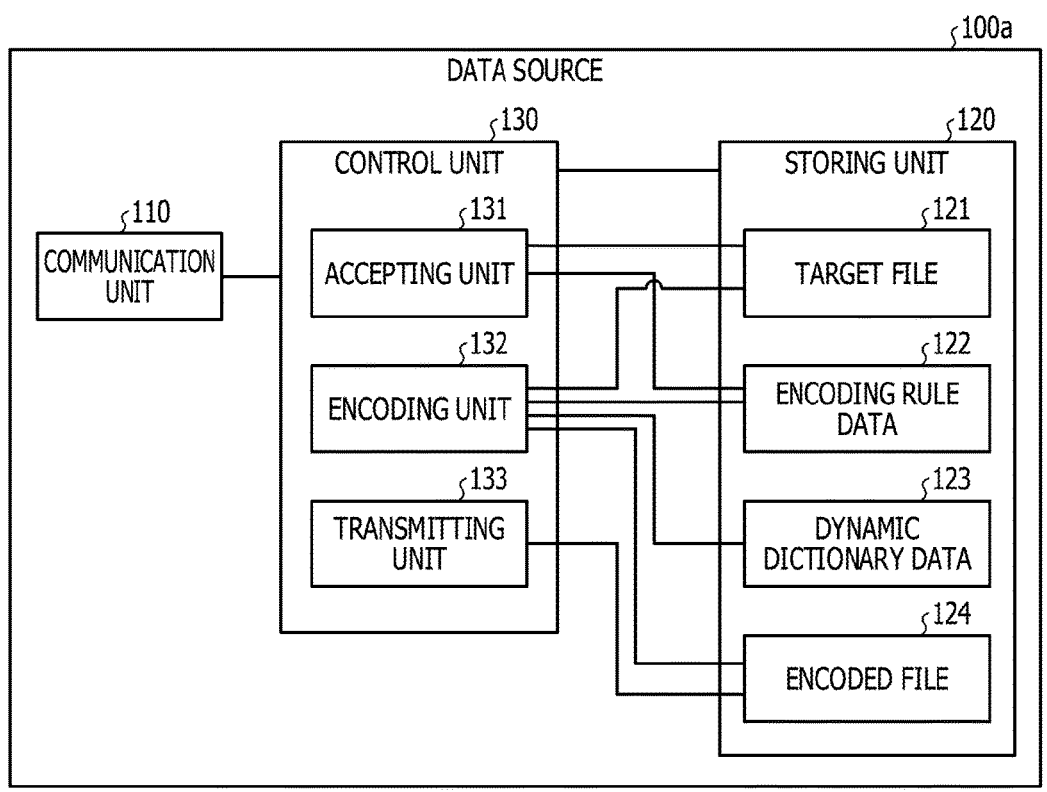
FIG. 8 is a functional block diagram illustrating a configuration of a data source.

Next, one example of the configuration of the data source 100a illustrated in FIG. 1 will be described. The configurations of the data sources 100b and 100c are similarly to the data source 100a. FIG. 8 is a functional block diagram illustrating a configuration of a data source. As illustrated in FIG. 8, the data source 100a includes a communication unit 110, a storing unit 120, and a control unit 130.

The communication unit 110 is a processing unit that carries out data communication with the data processing apparatus 200 through a network. The communication unit 110 corresponds to a communication apparatus such as a network card. The control unit 130 to be described later exchanges data with the data processing apparatus 200 through the communication unit 110.

The storing unit 120 stores a target file 121, encoding rule data 122, dynamic dictionary data 123, and an encoded file 124. The storing unit 120 corresponds to semiconductor memory elements such as random access memory (RAM), read only memory (ROM), and flash memory and a storing apparatus such as a hard disk drive (HDD).

The target file 121 is a CSV file that becomes a target of encoding. FIG. 9 is a diagram illustrating one example of a data structure of a target file. As illustrated in FIG. 9, the target file 121 is data that includes plural records having plural columns delimited by delimiters. For example, a column corresponding to the product code, a column corresponding to the product name, a column corresponding to the unit price, and a column corresponding to the quantity are included in the target file 121. The target file 121 may include another column.

The encoding rule data 122 is information that defines the types of columns as the encoding target and the order of arrangement of the columns when encoding is carried out. The encoding rule data 122 corresponds to the encoding rule 50a and so forth described with FIG. 3 and so forth. FIG. 10 is a diagram illustrating one example of a data structure of encoding rule data. As illustrated in FIG. 10, the encoding rule data 122 associates rule numbers with the types of columns.

In the encoding rule data 122 represented in FIG. 10, columns having data of product code, product name, unit price, and quantity are defined as the columns of the encoding target among the respective columns included in the target file 121. Furthermore, in the encoding rule data 122, the order of arrangement of the columns after encoding is defined as order of the column of the product code, the column of the product name, the column of the unit price, and the column of the quantity.

The dynamic dictionary data 123 is information in which words or numerical values included in a column are associated with dynamic codes on each column basis. The dynamic codes allocated to the words or numerical values are allocated at the time of encoding. FIG. 11 is a diagram illustrating one example of a data structure of dynamic dictionary data. For example, dynamic codes "A000h to A0FFh" are allocated to codes included in the column of the product code. Dynamic codes "A700h to A7FFh" are allocated to words included in the column of the product name. Dynamic codes "AA00h to AA01h" are allocated to numerical values included in the column of the quantity. Dynamic codes "A100h to A2FFh" are allocated to numerical values included in the column of the unit price.

The encoded file 124 is information generated by an encoding unit 132 to be described later. The data structure of the encoded file 124 corresponds to the data structure explained with the encoded file 20 described with FIG. 2. The encoded file 124 includes header, code region, and trailer.

Referring back to FIG. 8, the control unit 130 includes an accepting unit 131, the encoding unit 132, and a transmitting unit 133. The control unit 130 may be implemented by a central processing unit (CPU), a micro processing unit (MPU), or the like. Furthermore, the control unit 130 may be implemented also by hard-wired logic of an application specific integrated circuit (ASIC), a field programmable gate array (FPGA), or the like.

The accepting unit 131 is a processing unit that accepts various kinds of information from other apparatuses through a network and stores the accepted information in the storing unit 120. When accepting the target file 121 from other apparatuses, the accepting unit 131 stores the target file 121 in the storing unit 120.

Furthermore, the accepting unit 131 accepts a data acquisition instruction from the data processing apparatus 200. The encoding rule data 122 is included in the data acquisition instruction. The accepting unit 131 stores the encoding rule data 122 in the storing unit 120.

The encoding unit 132 is a processing unit that generates the encoded file 124 by encoding the target file 121 based on the encoding rule data 122. In the case of encoding the target file 121, the encoding unit 132 carries out dynamic encoding in units of column and associates words or numerical values included in the column with dynamic codes to generate the dynamic dictionary data 123.

Figure 12:
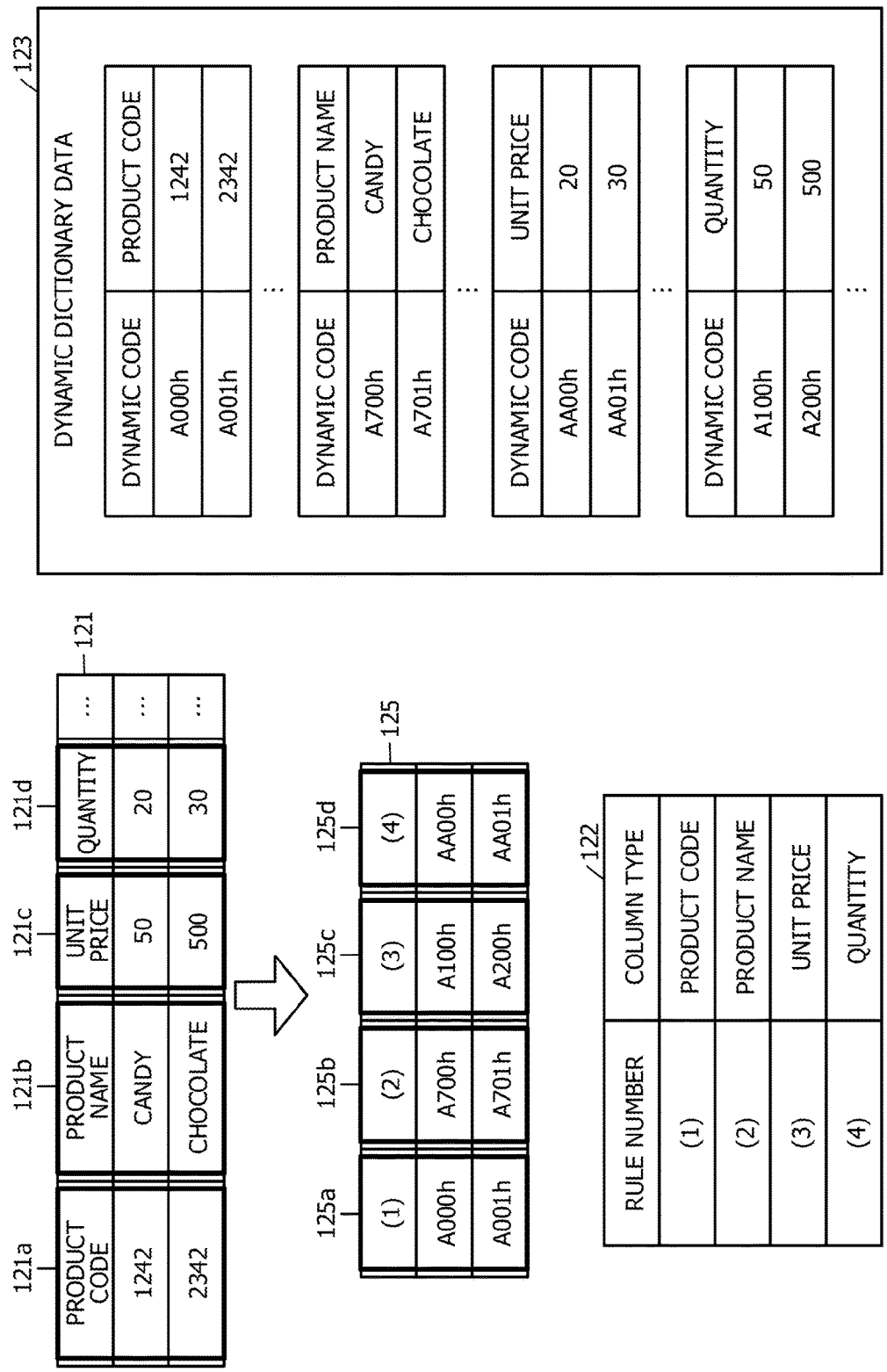
FIG. 12 is a diagram illustrating one example of encoding processing of a data source.

FIG. 12 is a diagram illustrating one example of encoding processing of a data source. As illustrated in FIG. 12, the encoding unit 132 selects, as the columns of the encoding target, columns 121a, 121b, 121c, and 121d defined in the encoding rule data 122 among the respective columns of the target file 121.

The column 121a is a column corresponding to the column type "product code" of the encoding rule data 122. The encoding unit 132 generates an encoded column 125a by allocating dynamic codes "A000h" and "A001h" to product codes "1242" and "2342." The encoding unit 132 stores the relationship between the produce codes and the dynamic codes in the dynamic dictionary data 123.

The column 121b is a column corresponding to the column type "product name" of the encoding rule data 122. The encoding unit 132 generates an encoded column 125b by allocating dynamic codes "A700h" and "A701h" to product names "Candy" and "Chocolate." The encoding unit 132 stores the relationship between the produce names and the dynamic codes in the dynamic dictionary data 123.

The column 121c is a column corresponding to the column type "unit price" of the encoding rule data 122. The encoding unit 132 generates an encoded column 125c by allocating dynamic codes "A100h" and "A200h" to unit prices "50" and "500." The encoding unit 132 stores the relationship between the unit prices and the dynamic codes in the dynamic dictionary data 123.

The column 121d is a column corresponding to the column type "quantity" of the encoding rule data 122. The encoding unit 132 generates an encoded column 125d by allocating dynamic codes "AA00h" and "AA01h" to quantities "20" and "30." The encoding unit 132 stores the relationship between the quantities and the dynamic codes in the dynamic dictionary data 123.

The encoding unit 132 generates data 125 by arranging the columns 125a to 125d in order of columns 125a, 125b, 125c, and 125d based on the order defined by the rule numbers of the encoding rule data 122.

The encoding unit 132 stores the data 125 in the code region of the encoded file 124 and stores the dynamic dictionary data 123 in the trailer. Furthermore, the encoding unit 132 stores various kinds of control information in the header of the encoded file 124.

The transmitting unit 133 is a processing unit that transmits the encoded file 124 generated by the encoding unit 132 to the data processing apparatus 200.

Figure 13:
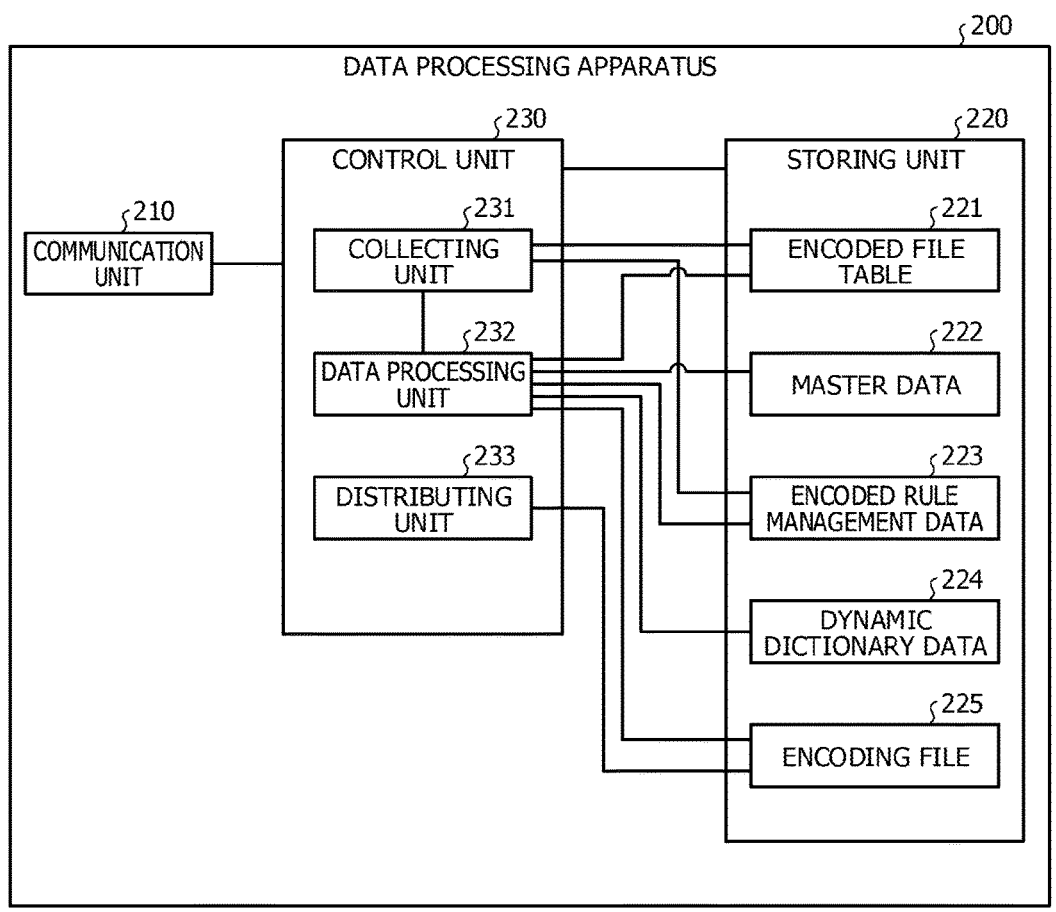
FIG. 13 is a functional block diagram illustrating a configuration of a data processing apparatus.

Next, one example of the configuration of the data processing apparatus 200 illustrated in FIG. 1 will be described. FIG. 13 is a functional block diagram illustrating a configuration of a data processing apparatus. As illustrated in FIG. 13, the data processing apparatus 200 includes a communication unit 210, a storing unit 220, and a control unit 230.

The communication unit 210 is a processing unit that carries out data communication with the data sources 100 or the external apparatus 90 through a network. The communication unit 210 corresponds to a communication apparatus such as a network card. The control unit 230 to be described later exchanges data with the data sources 100 or the external apparatus 90 through the communication unit 210.

The storing unit 220 includes an encoded file table 221, master data 222, encoding rule management data 223, dynamic dictionary data 224, and an encoded file 225. The storing unit 220 corresponds to semiconductor memory elements such as RAM, ROM, and flash memory and a storing apparatus such as an HDD.

The encoded file table 221 is a table that stores each encoded file collected from the respective data sources 100. FIG. 14 is a diagram illustrating one example of a data structure of an encoded file table. As illustrated in FIG. 14, the encoded file table 221 associates identification information with the encoded file. The identification information is information with which the data source 100 as the transmission source of the encoded file is uniquely identified. The encoded file is an encoded file collected from the data source 100 corresponding to the identification information.

The master data 222 is a CSV file held by the data processing apparatus 200. The master data 222 is data that includes plural records having plural columns delimited by delimiters.

Figure 15:
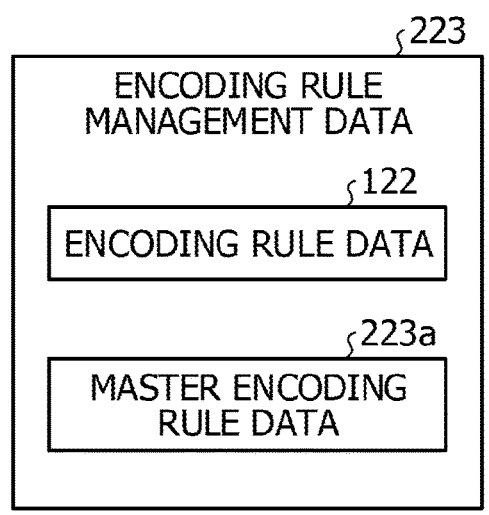
FIG. 15 is a diagram illustrating one example of a data structure of encoding rule management data.

The encoding rule management data 223 includes data of the encoding rule. FIG. 15 is a diagram illustrating one example of a data structure of encoding rule management data. As illustrated in FIG. 15, the encoding rule management data 223 includes the encoding rule data 122 and master encoding rule data 223a. The encoding rule data 122 is information that defines the types of columns as the encoding target and the order of arrangement of the columns when encoding is carried out. The encoding rule data 122 is transmitted to the data source 100. The encoding rule data 122 is information corresponding to the encoding rules 50a and 50d represented in FIG. 3 to FIG. 6.

The master encoding rule data 223a is information that defines, regarding the master data 222, the types of columns as the encoding target and the order of arrangement of the columns when encoding is carried out. For example, the master encoding rule data 223a is information corresponding to the encoding rule 50b described with FIG. 5.

The dynamic dictionary data 224 is data obtained by combining pieces of dynamic dictionary data stored in the trailers of the respective encoded files stored in the encoded file table 221. For example, the dynamic dictionary data 224 is information corresponding to the dynamic dictionaries 60b, 62b, 63b, and 64b represented in FIG. 3 to FIG. 6.

Referring back to FIG. 13, the control unit 230 includes a collecting unit 231, a data processing unit 232, and a distributing unit 233. The control unit 230 may be implemented by a CPU, MPU, or the like. Furthermore, the control unit 230 may be implemented also by hard-wired logic of an ASIC, FPGA, or the like.

The collecting unit 231 receives a request for data processing from the external apparatus 90. The encoding rule data 122 and the contents of processing are included in the request for data processing received from the external apparatus 90. In the contents of processing, instruction information on combining of encoded files, combining of encoded file and master data, arithmetic operation of an encoded file, and so forth is included. Furthermore, the collecting unit 231 may acquire the master encoding rule data 223a from the external apparatus 90. The collecting unit 231 outputs the contents of processing to the data processing unit 232.

When receiving the data processing request from the external apparatus 90, the collecting unit 231 generates a data acquisition instruction. The collecting unit 231 stores the encoding rule data 122 of the encoding rule management data 223 in the data acquisition instruction and outputs the data acquisition instruction to the data source 100.

The collecting unit 231 receives an encoded file that corresponds to the data acquisition instruction and is encoded based on the encoding rule data 122 from the data source 100 and stores the encoded file in the encoded file table 221.

The data processing unit 232 is a processing unit that executes data processing corresponding to the request for data processing accepted from the external apparatus 90. The data processing unit 232 executes processing, with the encoded file remaining in the encoded state. As one example, description will be made sequentially about the cases in which the request for data processing is "combining of encoded files," "combining of encoded file and master data," and "arithmetic operation of an encoded file."

First, one example of processing of the data processing unit 232 in the case in which the request for data processing is "combining of encoded files" will be described. This processing corresponds to the processing described with FIG. 3. The description will be made with use of FIG. 3. The data processing unit 232 acquires, from the encoded file table 221, the data 21a included in the encoded file collected from the data source 100a and the data 22a included in the encoded file collected from the data source 100b.

The data processing unit 232 generates the data 60a by combining pieces of data of columns corresponding to the same rule number based on the encoding rule 50a. Furthermore, the data processing apparatus 200 generates the dynamic dictionary 60b by combining the dynamic dictionary 21b and the dynamic dictionary 22b. The data processing unit 232 acquires the dynamic dictionary 21b and the dynamic dictionary 22b from the encoded file table 221. The data processing unit 232 stores the dynamic dictionary 60b in the dynamic dictionary data 224.

The data processing unit 232 generates the encoded file 225 by storing the data 60a in the code region of the encoded file 225 and storing the dynamic dictionary data 224 in the trailer of the encoded file 225.

It is to be noted that the data processing unit 232 carries out adjustment of the dynamic code if overlapping exists in dynamic codes of the dynamic dictionary resulting from the combining as described with FIG. 4.

Subsequently, one example of processing of the data processing unit 232 in the case in which the request for data processing is "combining of encoded file and master data" will be described. This processing corresponds to the processing described with FIG. 5. The description will be made with use of FIG. 5. The data processing unit 232 acquires the data 25a included in the encoded file collected from the data source 100a from the encoded file table 221. Furthermore, the data processing unit 232 generates the data 26a and the dynamic dictionary 26b by carrying out encoding the master data 222 for each column based on the master encoding rule data 223a (encoding rule 50b).

The data processing unit 232 generates the data 63a by comparing the pieces of data of the same column (product code) based on the encoding rules 50a and 50b and adding the column corresponding to the data 26a that matches the data 25a (unit price) to the data 25a. For example, a dynamic code "A000h" of the product code on the first row and first column of the data 25a matches a dynamic code "A000h" on the first row and first column of the data 26a. Thus, the data processing unit 232 registers a dynamic code "A100h" on the first row and second column of the data 26a onto the first row and fourth column of the data 63a.

For example, a dynamic code "A001h" of the product code on the second row and first column of the data 25a matches a dynamic code "A001h" on the second row and first column of the data 26a. Thus, the data processing unit 232 registers a dynamic code "A200h" on the second row and second column of the data 26a onto the second row and fourth column of the data 63a.

The data processing unit 232 generates the encoding rule 50c by combining the encoding rule 50a and the encoding rule 50b. The encoding rule 50c is an encoding rule corresponding to the data 63a after the combining.

The data processing unit 232 generates the dynamic dictionary 63b by combining the dynamic dictionary 25b and the dynamic dictionary 26b. The data processing unit 232 acquires the dynamic dictionary 25b and the dynamic dictionary 26b from the encoded file table 221. The data processing unit 232 stores the dynamic dictionary 63b in the dynamic dictionary data 224.

The data processing unit 232 generates the encoded file 225 by storing the data 63a in the code region of the encoded file 225 and storing the dynamic dictionary data 224 in the trailer of the encoded file 225.

Subsequently, one example of processing of the data processing unit 232 in the case in which the request for data processing is "arithmetic operation of an encoded file" will be described. This processing corresponds to the processing described with FIG. 6. The description will be made with use of FIG. 6. The data processing unit 232 acquires the data 27a included in the encoded file collected from the data source 100a from the encoded file table 221.

The data processing unit 232 prepares the dynamic dictionary 28b for storing the column of the total amount before carrying out arithmetic operation of the total amount. In the dynamic dictionary 28b in FIG. 6, a dynamic code "D000h" allocated to the total amount corresponding to a product code "1242 (A000h)" is set. A dynamic code "D001h" allocated to the total amount corresponding to a product code "2342 (A001h)" is set.

Moreover, the data processing unit 232 generates the data 64a by combining the data 28a including the dynamic codes allocated in the dynamic dictionary 28b and the data 27a. The data processing unit 232 generates the dynamic dictionary 64b by combining the dynamic dictionary 27b and the dynamic dictionary 28b.

After executing the above-described processing, the data processing unit 232 carries out arithmetic operation of the total amount corresponding to the product code "1242 (A000h)" and the total amount corresponding to the product code "2342 (A001h)," and sets the calculation result in the dynamic dictionary 28b. The contents of the arithmetic operation executed by the data processing unit 232 correspond to the contents described with FIG. 6.

The data processing unit 232 generates the encoded file 225 by storing the data 64a in the code region of the encoded file 225 and storing the dynamic dictionary 64b in the trailer.

The distributing unit 233 is a processing unit that distributes the encoded file 225 generated by the data processing unit 232 to the external apparatus 90.

Figure 16:
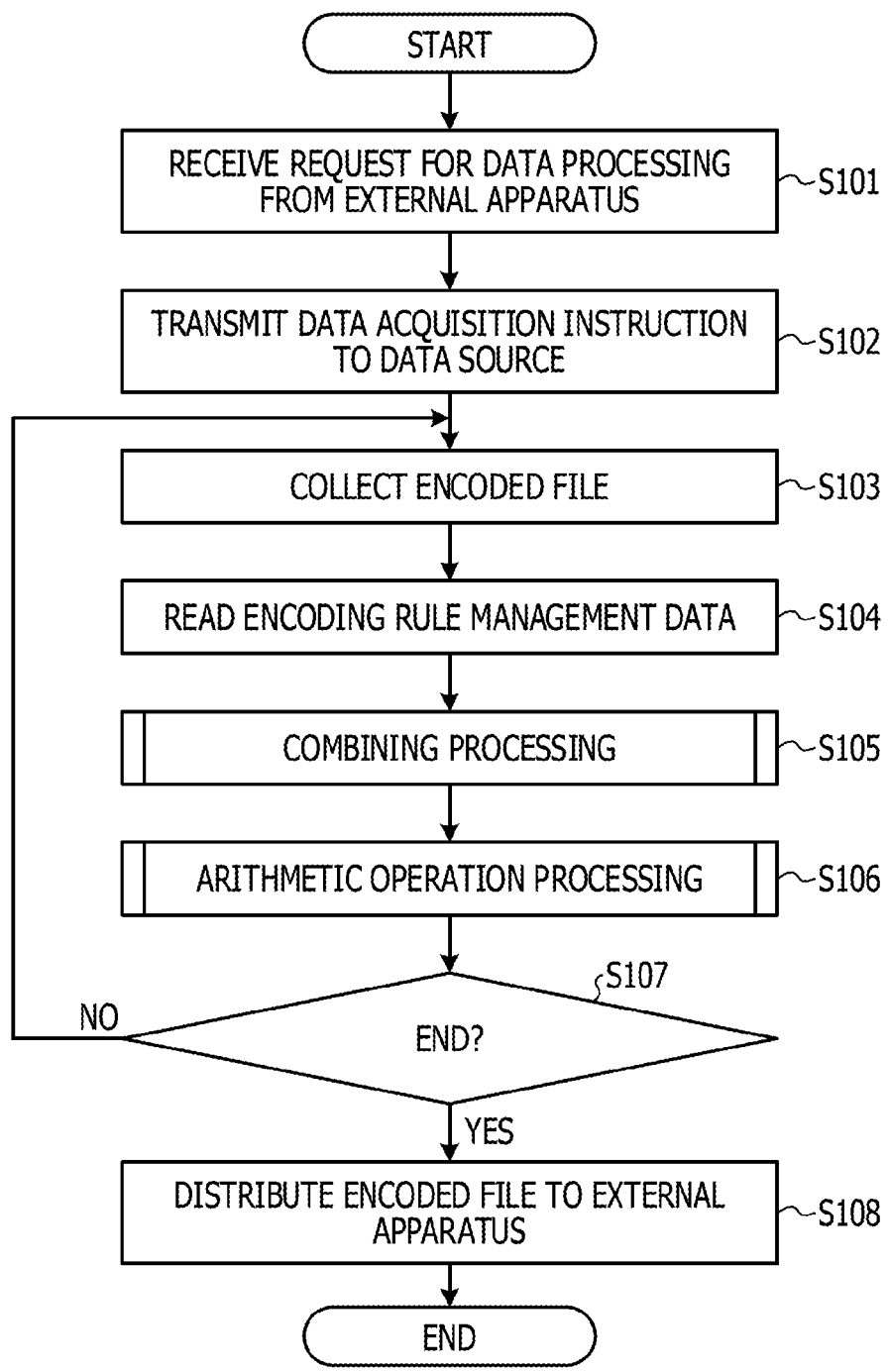
FIG. 16 is a flowchart illustrating processing procedure of a data processing apparatus.

Next, processing procedure of the data processing apparatus 200 according to the present embodiment will be described. FIG. 16 is a flowchart illustrating processing procedure of a data processing apparatus. As represented in FIG. 16, the collecting unit 231 of the data processing apparatus 200 receives a request for data processing from the external apparatus 90 (step S101). The collecting unit 231 transmits a data acquisition instruction to the data source 100 (step S102).

The collecting unit 231 collects the encoded file (step S103). The data processing unit 232 of the data processing apparatus 200 reads the encoding rule management data 223 (step S104). The data processing unit 232 executes combining processing (step S105). The data processing unit 232 executes arithmetic operation processing (step S106).

The data processing apparatus 200 determines whether or not to end the processing (step S107). If the data processing apparatus 200 does not end the processing (step S107, No), the data processing apparatus 200 makes a transition to the step S103.

If the data processing apparatus 200 ends the processing (step S107, Yes), the data processing apparatus 200 makes a transition to the step S108. The distributing unit 233 of the data processing apparatus 200 distributes the encoded file to the external apparatus 90 (step S108).

Figure 17:
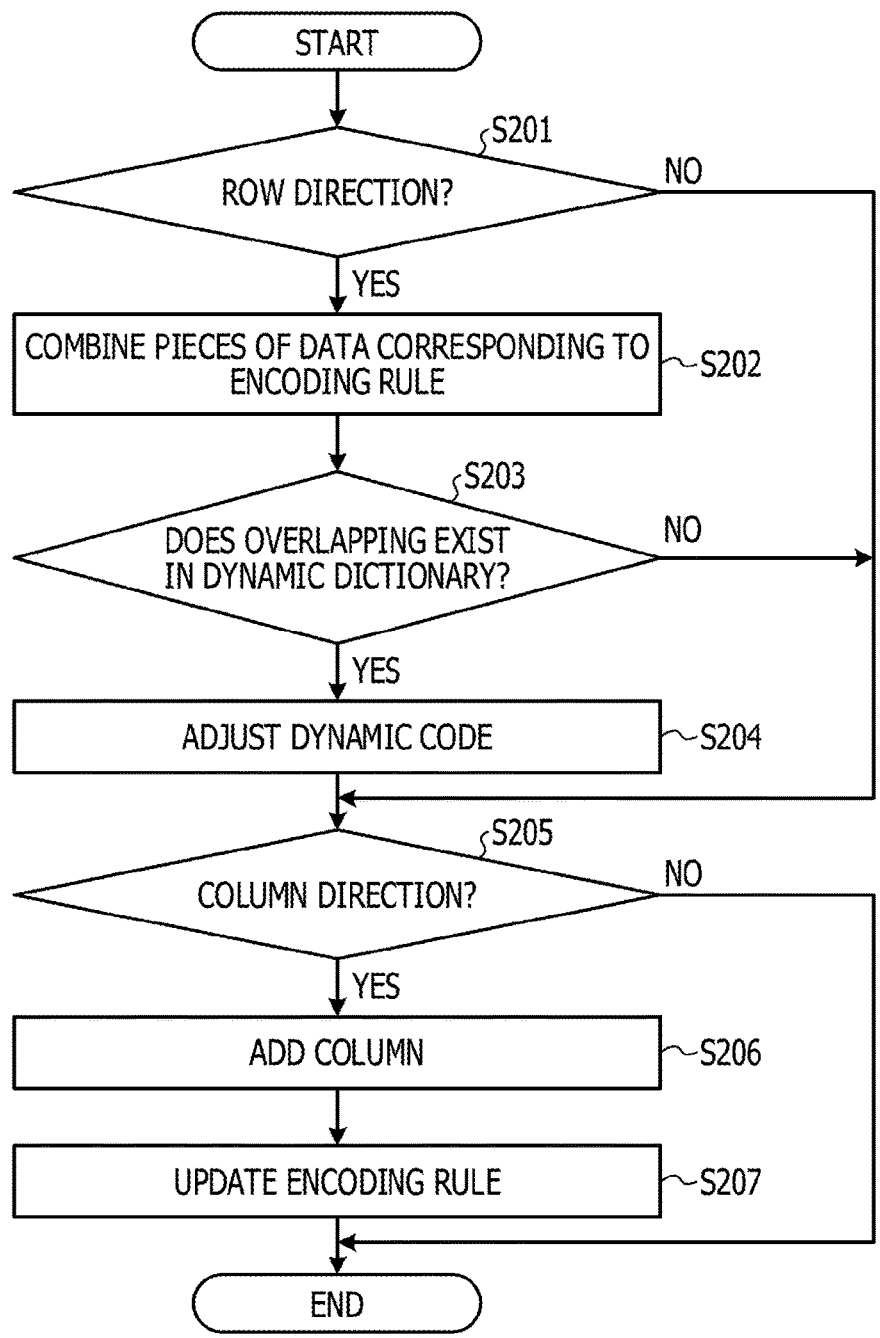
FIG. 17 is a flowchart illustrating processing procedure of combining processing.

Next, processing procedure of the combining processing represented in the step S105 in FIG. 16 will be described. FIG. 17 is a flowchart illustrating processing procedure of combining processing. As represented in FIG. 17, if the direction of the combining is the row direction (step S201, Yes), the data processing unit 232 of the data processing apparatus 200 makes a transition to a step S202. If the direction of the combining is not the row direction (step S201, No), the data processing unit 232 makes a transition to a step S205.

The data processing unit 232 combines pieces of data corresponding to the encoding rule (step S202). The data processing unit 232 determines whether or not overlapping exists in a dynamic dictionary (step S203). If overlapping exists in the dynamic dictionary (step S203, Yes), the data processing unit 232 adjusts a dynamic code (step S204) and makes a transition to the step S205. If overlapping does not exist in the dynamic dictionary (step S203, No), the data processing unit 232 makes a transition to the step S205.

If the direction of the combining is the column direction (step S205, Yes), the data processing unit 232 makes a transition to a step S206. If the direction of the combining is not the column direction (step S205, No), the data processing unit 232 ends the combining processing.

The data processing unit 232 adds a column (step S206). The data processing unit 232 updates the encoding rule (step S207). The processing described with FIG. 17 corresponds to the processing described with FIG. 3 to FIG. 5.

Figure 18:
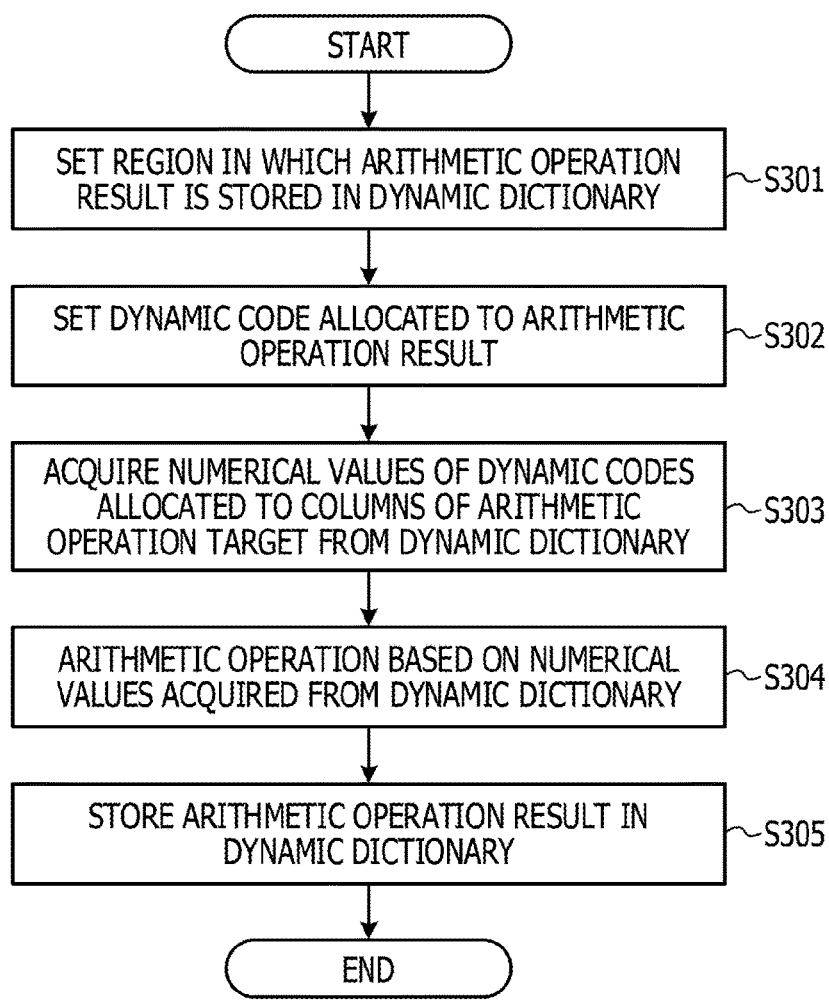
FIG. 18 is a flowchart illustrating processing procedure of arithmetic operation processing.

Next, processing procedure of the arithmetic operation processing represented in the step S106 in FIG. 16 will be described. FIG. 18 is a flowchart illustrating processing procedure of arithmetic operation processing. As represented in FIG. 18, the data processing unit 232 of the data processing apparatus 200 sets a region in which an arithmetic operation result is stored in a dynamic dictionary (step S301).

The data processing unit 232 sets the dynamic code allocated to the arithmetic operation result (step S302). The data processing unit 232 acquires the numerical values of dynamic codes allocated to the columns of the arithmetic operation target from the dynamic dictionary (step S303).

The data processing unit 232 carries out arithmetic operation based on the numerical values acquired from the dynamic dictionary (step S304). The data processing unit 232 stores the arithmetic operation result in the dynamic dictionary (step S305). The processing described with FIG. 18 corresponds to the processing described with FIG. 6.

Next, effects of the data processing apparatus 200 according to the present embodiment will be described. The data processing apparatus 200 acquires encoded files subjected to dynamic encoding on each column basis from the data sources 100 and executes data processing of combining, arithmetic operation, and so forth based on a specific encoding rule, with the encoded data remaining in the encoded state (without decoding the encoded data). Thus, data processing between pieces of target data may be executed at high speed without executing analysis processing about each of the encoded files from the plural data sources 100.

Information on a dynamic dictionary that represents the relationship between words or numerical values and dynamic codes is included in the trailer of the encoded file collected from the data source 100. Thus, by referring to this dynamic dictionary, the data processing apparatus 200 may execute data processing of combining, arithmetic operation, and so forth, with the encoded data remaining in the encoded state (without decoding the encoded data).

In the case of carrying out arithmetic operation of numerical values, the data processing apparatus 200 sets the dynamic code allocated to the arithmetic operation result in advance and identifies the respective numerical values as the arithmetic operation target based on dynamic codes corresponding to the numerical values and a dynamic dictionary to execute the arithmetic operation. Furthermore, the data processing apparatus 200 associates the arithmetic operation result with the dynamic code set in advance and registers the arithmetic operation result in the dynamic dictionary. By executing such processing, decompression of the encoded file, column dividing, and numerical value conversion (conversion from text to binary and from binary to text) may be omitted as described with FIG. 7 and thus the arithmetic operation processing may be executed at high speed.

In the case of combining plural encoded files, the data processing apparatus 200 also combines dynamic dictionaries of the respective encoded files. Here, if overlapping of dynamic codes exists in the dynamic dictionary resulting from the combining, the data processing apparatus 200 adjusts a dynamic code. For this reason, it is possible to suppress associating of plural words or numerical values with the same dynamic code.

Figure 19:
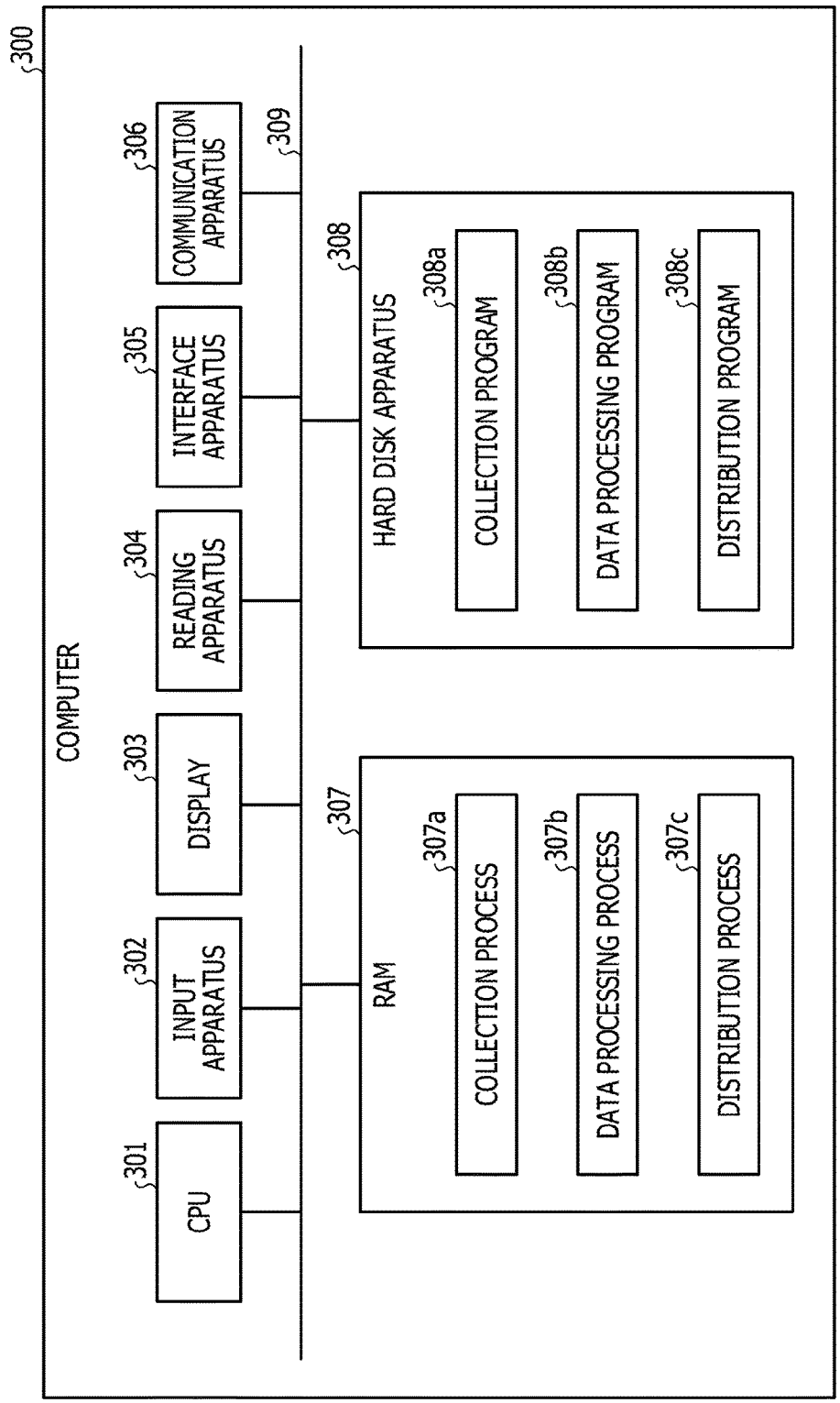
FIG. 19 is a diagram illustrating one example of a hardware configuration of a computer that implements similar functions to a data processing apparatus.
Figure 20:
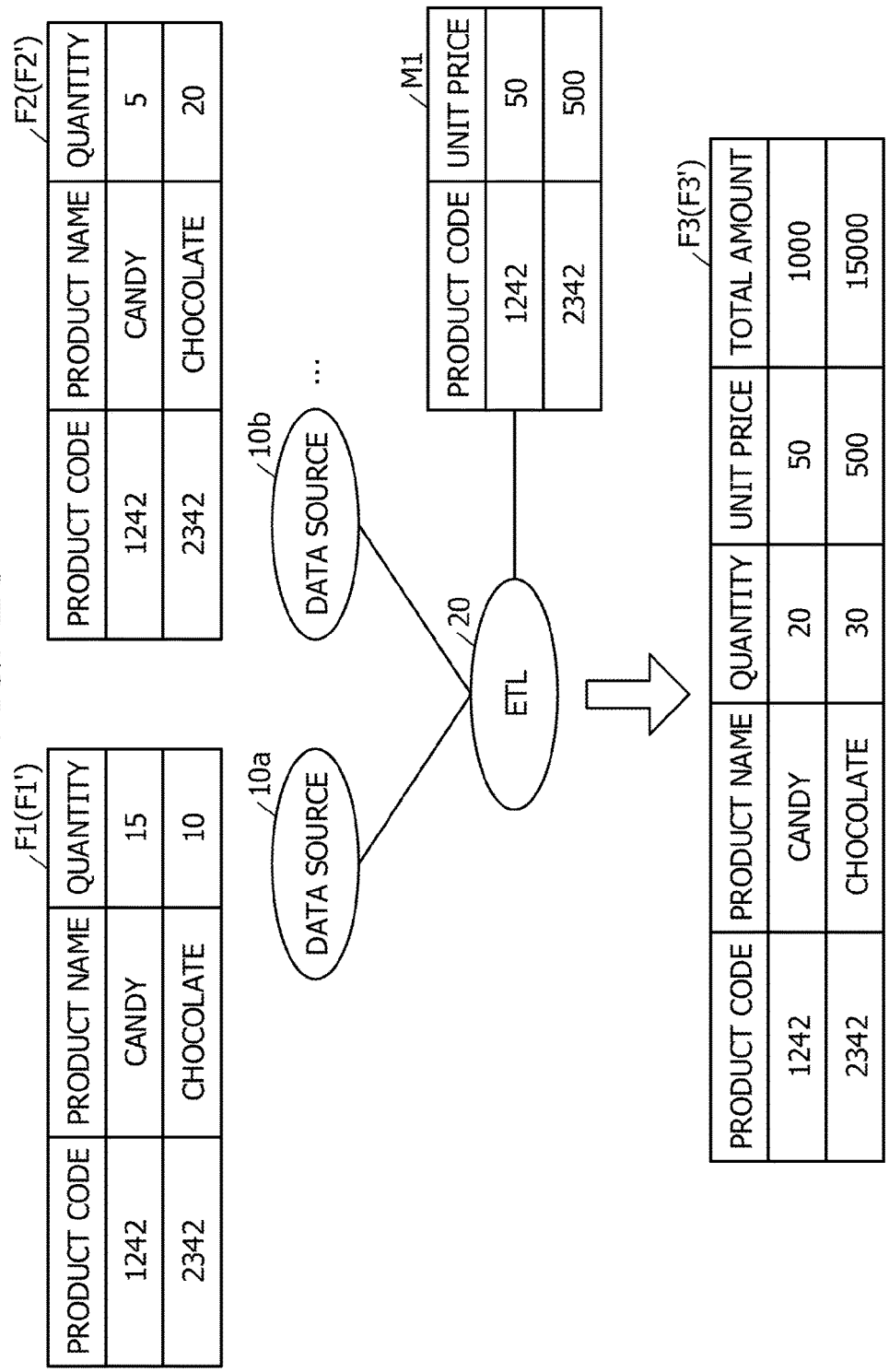
FIG. 20 is a diagram for explaining one example of an information system of a related art.

Next, description will be made about one example of the hardware configuration of a computer that implements similar functions to the data processing apparatus 200 represented in the above-described embodiment. FIG. 19 is a diagram illustrating one example of a hardware configuration of a computer that implements similar functions to a data processing apparatus.

As illustrated in FIG. 19, a computer 300 includes a CPU 301 that executes various kinds of arithmetic operation processing, an input apparatus 302 that accepts input of data from a user, and a display 303. Furthermore, the computer 300 includes a reading apparatus 304 that reads a program or the like from a storage medium and an interface apparatus 305 that exchanges data with another computer through a network. The computer 300 includes a communication apparatus 306. Moreover, the computer 300 includes a RAM 307 that temporarily stores various kinds of information and a hard disk apparatus 308. In addition, the respective apparatuses 301 to 308 are coupled to a bus 309.

The hard disk apparatus 308 includes a collection program 308a, a data processing program 308b, and a distribution program 308c. The CPU 301 reads out the collection program 308a, the data processing program 308b, and the distribution program 308c and loads the collection program 308a, the data processing program 308b, and the distribution program 308c into the RAM 307.

The collection program 308a functions as a collection process 307a. The data processing program 308b functions as a data processing process 307b. The distribution program 308c functions as a distribution process 307c.

Processing of the collection process 307a corresponds to processing of the collecting unit 231. Processing of the data processing process 307b corresponds to processing of the data processing unit 232. Processing of the distribution process 307c corresponds to processing of the distributing unit 233.

It is to be noted that the respective programs 308a to 308c do not necessarily have to be stored in the hard disk apparatus 308 from the beginning. For example, the respective programs may be stored in a "portable physical medium" such as a flexible disc (FD), compact disc (CD)-ROM, digital versatile disc (DVD) disc, magneto-optical disc, or integrated circuit (IC) card inserted into the computer 300. Furthermore, the computer 300 may read out and execute the respective programs 308a to 308c.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various changes, substitutions, and alterations could be made hereto without departing from the spirit and scope of the invention.

What is claimed is:

1. A data processing method executed by a computer, the data processing method comprising:

acquiring first encoded data and second encoded data when receiving a request for data processing, the first encoded data being generated by encoding, for each column in accordance with a first encoding rule, data that includes one or more records having one or more columns, the second encoded data being generated by encoding, for each column in accordance with a second encoding rule, other data that includes one or more other records having one or more other columns;

specifying a first code relating to a second code in accordance with the first encoding rule and the second encoding rule without decoding the first encoded data and the second coded data, the first code being included in the first encoded data, the second code being included in the second encoded data; and generating third encoded data in which the first code and the second code are stored in association with each other.

2. The data processing method according to claim 1, wherein the first encoded data and the second encoded data are data of a table format and the first encoding rule and the second encoding rule represent a type of each column of the data of the table format.

3. The data processing method according to claim 1, wherein the first encoded data and the second encoded data are acquired from data sources different from each other.

4. The data processing method according to claim 1, wherein the third encoded data is data of a table format and the first code and the second code are stored in a same column or a same record in the third encoded data.

5. The data processing method according to claim 1, wherein the generating includes storing a third code in association with the first code and the second code in the third encoded data, the third code being obtained by encoding third data decided on the basis of first data before encoding of the first code and second data before encoding of the second code.

6. The data processing method according to claim 5, wherein the first data is specified by reference to a first dynamic dictionary associated with the first encoded data and the second data is specified by reference to a second dynamic dictionary associated with the second encoded data, and the first dynamic dictionary and the second dynamic dictionary are acquired simultaneously with the first encoded data and the second encoded data, respectively.

7. The data processing method according to claim 5, wherein the generating the third encoded data includes generating a dynamic dictionary in which the third data is associated with the third code.

8. The data processing method according to claim 1, wherein the one or more columns and the one or more other columns are delimited by delimiters.

9. A data processing apparatus comprising:

a memory; and a processor coupled to the memory and the processor configured to:

acquire first encoded data and second encoded data when receiving a request for data processing, the first encoded data being generated by encoding, for each column in accordance with a first encoding rule, data that includes one or more records having one or more columns, the second encoded data being generated by encoding, for each column in accordance with a second encoding rule, other data that includes one or more other records having one or more other columns;

specify a first code relating to a second code in accordance with the first encoding rule and the second encoding rule without decoding the first encoded data and the second coded data, the first code being included in the first encoded data, the second code being included in the second encoded data; and perform a generating process of third encoded data in which the first code and the second code are stored in association with each other.

10. The data processing apparatus according to claim 9, wherein the first encoded data and the second encoded data are data of a table format and the first encoding rule and the second encoding rule represent a type of each column of the data of the table format.

11. The data processing apparatus according to claim 9, wherein the first encoded data and the second encoded data are acquired from data sources different from each other.

12. The data processing apparatus according to claim 9, wherein the third encoded data is data of a table format and the first code and the second code are stored in a same column or a same record in the third encoded data.

13. The data processing apparatus according to claim 9, wherein the generating process includes storing a third code in association with the first code and the second code in the third encoded data, the third code being obtained by encoding third data decided on the basis of first data before encoding of the first code and second data before encoding of the second code.

14. The data processing apparatus according to claim 13, wherein the first data is specified by reference to a first dynamic dictionary associated with the first encoded data and the second data is specified by reference to a second dynamic dictionary associated with the second encoded data, and the first dynamic dictionary and the second dynamic dictionary are acquired simultaneously with the first encoded data and the second encoded data, respectively.

15. The data processing apparatus according to claim 13, wherein the generating process includes generating a dynamic dictionary in which the third data is associated with the third code.

16. The data processing apparatus according to claim 9, wherein the one or more columns and the one or more other columns are delimited by delimiters.

17. A non-transitory computer-readable medium storing a data processing program that causes a computer to execute a method comprising:

acquiring first encoded data and second encoded data when receiving a request for data processing, the first encoded data being generated by encoding, for each column in accordance with a first encoding rule, data that includes one or more records having one or more columns, the second encoded data being generated by encoding, for each column in accordance with a second encoding rule, other data that includes one or more other records having one or more other columns;

specifying a first code relating to a second code in accordance with the first encoding rule and the second encoding rule without decoding the first encoded data and the second coded data, the first code being included in the first encoded data, the second code being included in the second encoded data; and generating third encoded data in which the first code and the second code are stored in association with each other.

* * * * *